(12) United States Patent
Shimada

(10) Patent No.: US 7,651,895 B2
(45) Date of Patent: Jan. 26, 2010

(54) TRANSISTOR, METHOD FOR MANUFACTURING THEREOF, SUBSTRATE FOR AN ELECTROOPTICAL DEVICE

(75) Inventor: Hiroyuki Shimada, Kofu (JP)

(73) Assignee: Seiko Epson Corporation, Tokyo (JP)

( * ) Notice: Subject to any disclaimer, the term of this patent is extended or adjusted under 35 U.S.C. 154(b) by 441 days.

(21) Appl. No.: 11/363,994

(22) Filed: Mar. 1, 2006

(65) Prior Publication Data
US 2006/0214239 A1 Sep. 28, 2006

(30) Foreign Application Priority Data
Mar. 28, 2005 (JP) ............... 2005-090317

(51) Int. Cl.
*H01L 21/00* (2006.01)
(52) U.S. Cl. ............... 438/149; 257/E21.345
(58) Field of Classification Search ......... 257/336, 257/E21.345, E21.431, E21.444, E21.548, 257/E21.619, E21.634, E27.06, E27.064, 257/E29.267; 438/149
See application file for complete search history.

(56) References Cited
U.S. PATENT DOCUMENTS
7,145,202 B2 12/2006 Kitahara

2002/0019103 A1 * 2/2002 Lin et al. ............... 438/302

FOREIGN PATENT DOCUMENTS

| JP | A-05-235033 | 9/1993 |
| JP | A-06-334-185 | 12/1994 |
| JP | A-2001-318625 | 11/2001 |
| JP | A-2003-007717 | 1/2003 |
| JP | A 2003-257990 | 9/2003 |
| JP | A-2004-247541 | 9/2004 |

\* cited by examiner

*Primary Examiner*—Davienne Monbleau
*Assistant Examiner*—Matthew Reames
(74) *Attorney, Agent, or Firm*—Oliff & Berridge, PLC

(57) ABSTRACT

Aspects of the invention can provide a transistor that can include a supporting substrate, a semiconductor film formed on an underlying insulating film provided on the supporting substrate and including a channel region and source and drain regions, and a gate electrode provided above the channel region. The semiconductor film can include a lightly doped region in which an impurity is injected at a low concentration between the channel region and the source and drain regions. The source and drain regions can include a heavily doped region in which an impurity is injected at a higher concentration than the lightly doped region. At least part of the lightly doped region provided along an inner wall of a groove can be provided on the supporting substrate.

8 Claims, 3 Drawing Sheets

TRANSISTOR, METHOD FOR MANUFACTURING THEREOF, SUBSTRATE FOR AN ELECTROOPTICAL DEVICE

This application claims the benefit of Japanese Patent Application No. 2005-090317, filed Mar. 28, 2005. The entire disclosure of the prior application is hereby incorporated by reference herein in its entirety.

BACKGROUND OF THE INVENTION

1. Technical Field

The present invention relates to a transistor, a method for manufacturing thereof, and a substrate for an electrooptical device.

2. Related Art

As an example of typical transistors, a thin-film transistor (TFT) is provided on an insulating substrate and includes a semiconductor film having source, channel and drain regions, a gate electrode, and drain and source electrodes coupled to the source and drain regions, respectively.

The TFT is used as a switching element for each pixel in a transmissive liquid crystal panel as a substrate for an electrooptical device.

To drive the transmissive liquid crystal panel, a high voltage of about 15 V needs to be applied to the TFT. However, the higher the voltage applied to the gate electrode, the more off-leakage current occurs depending on the voltage. It has been known that a lightly doped drain (LDD) region in which an impurity is dispersed in a low concentration between the channel region and the source/drain regions works effectively to reduce this off-leakage current, as well as LSI technology. JP-A-2003-257990 is an example of related art.

As for the transmissive liquid crystal panel, it is required to narrow the pitch between pixels, increase the aperture ratio, and provide a high-definition display. To produce a smaller TFT serving as a switching element included in each pixel, there has developed a way to reduce the length of individual gates to narrow the pitch between pixels.

However, to apply a high voltage as mentioned above to the gate electrode with the reduced gate length, it is necessary to enlarge the LDD region to increase an area available as an electric field. The need for the enlarged LDD region results in an insufficient reduction in the size of the TFT as a whole despite the reduced gate length.

It is therefore difficult to reduce the size of the TFT while maintaining the resistance to driving voltage.

SUMMARY

An advantage of the present invention is to provide a transistor, a method for manufacturing thereof, and a substrate for an electrooptical device that have resistance to driving voltage with reduced size.

A transistor according to a first aspect of the invention includes a supporting substrate, a semiconductor film formed on an underlying insulating film provided on the supporting substrate and including a channel region and source and drain regions, and a gate electrode provided above the channel region. The semiconductor film includes a lightly doped region in which an impurity is injected in a low concentration between the channel region and the source and drain regions. The source and drain regions include a heavily doped region in which an impurity is injected in a higher concentration than the lightly doped region. At least part of the lightly doped region is provided along an inner wall of a groove provided on the supporting substrate.

With the transistor of this aspect including the lightly doped region along the inner wall of the groove provided to the supporting substrate with the underlying insulating film therebetween, the lightly doped region can be enlarged to the extent of the inner wall of the groove without increasing the apparent size of the region in a planar view.

Furthermore, since the transistor has the lightly doped drain (LDD) structure including the lightly doped region between the channel region and the heavily doped source/drain regions, it is possible to reduce off-leakage current in the drain region.

Since the lightly doped region can be enlarged without changing its apparent size, it is possible to apply a high voltage to the gate electrode even with the reduced gate length so as to reduce the size of the transistor.

Therefore, it is possible to reduce the size of the transistor while it maintains resistance to voltage.

A transistor according to a second aspect of the invention includes an insulating substrate, a semiconductor film formed on the insulating substrate and including a channel region and source and drain regions, and a gate electrode provided above the channel region. The semiconductor film includes a lightly doped region in which an impurity is injected in a low concentration between the channel region and the source and drain regions. The source and drain regions include a heavily doped region in which an impurity is injected in a higher concentration than the lightly doped region. At least part of the lightly doped region is provided on at least part of an inner wall of a groove provided to the insulating substrate.

With the transistor of this aspect including the lightly doped region along the inner wall of the groove provided to the insulating substrate, the lightly doped region can be enlarged to the extent of the inner wall of the groove without increasing the apparent size of the region in a planar view.

Furthermore, since the transistor has the LDD structure, it is possible to reduce off-leakage current in the drain region.

Since the lightly doped region can be enlarged without changing its apparent size, it is possible to apply a high voltage to the gate electrode even with the reduced gate length so as to reduce the size of the transistor. Therefore, it is possible to reduce the size of the transistor while it maintains resistance to voltage.

A method for manufacturing a transistor according to a third aspect of the invention includes providing a semiconductor film on an insulating substrate provided with a groove by forming a first portion of the semiconductor film in an inner surface of the groove, providing a gate electrode above the semiconductor film, injecting an impurity into the semiconductor film at a predetermined angle to the insulating substrate, exposing a second portion other than the first portion of the semiconductor film, after an insulating film covering the gate electrode and the semiconductor film are provided, by etching part of the insulating film, and providing a source or drain region by injecting an impurity into at least part of the second portion.

Since the method for manufacturing a transistor provides the semiconductor film along the inner wall of the groove provided to the insulating substrate, the semiconductor film can be enlarged to the extent of the groove without increasing the apparent size of the film in a planar view.

For example, when the angle to the insulating substrate is set at a tilted angle in which an impurity can be injected into the semiconductor film along the inner wall of the groove, it is possible to inject the impurity into the whole of the semiconductor film including its part along the inner wall of the groove without fail. Here, the gate electrode functions as a mask, thereby preventing impurity injection into a semiconductor region under the gate electrode and providing a channel region.

Furthermore, by injecting an impurity into the second portion to be the source or drain region in a high concentration, for example, it is possible to provide a transistor with the LDD structure and reduce off-leakage current. It is noted that the first portion is a lightly doped region which includes an impurity in a low concentration.

By adjusting the depth of the groove, it is possible to make a transistor that has a small apparent size and a large lightly doped region. Therefore, this transistor has sufficient resistance to voltage for the gate electrode even with a reduced gate length.

Therefore, it is possible to reduce the size of the transistor while it maintains resistance to voltage.

A method for manufacturing a transistor according to a fourth aspect of the invention includes providing an underlying insulating film on a supporting substrate provided with a groove, providing a semiconductor film on the underlying insulating film by forming a first portion of the semiconductor film inside the groove, providing a gate electrode above the semiconductor film, injecting an impurity into the semiconductor film at a predetermined angle to the supporting substrate, exposing a second portion other than the first portion of the semiconductor film, after an insulating film covering the gate electrode and the semiconductor film are provided, by etching part of the insulating film, and providing a source or drain region by injecting an impurity into at least part of the second portion.

Since the method for manufacturing a transistor provides the semiconductor film along the inner wall of the groove provided to the underlying insulating film, the semiconductor film can be enlarged to the extent of the groove without increasing the apparent size of the film in a planar view.

For example, when the angle to the supporting substrate is set at a tilted angle in which an impurity can be injected into the semiconductor film along the inner wall of the groove, it is possible to inject the impurity into the whole of the semiconductor film including its part along the inner wall of the groove without fail. Here, the gate electrode functions as a mask, thereby preventing impurity injection into a semiconductor region under the gate electrode and providing a channel region.

Furthermore, by injecting an impurity into the second portion to be the source or drain region in a high concentration, for example, it is possible to provide a transistor with the LDD structure.

By adjusting the depth of the groove, it is possible to make a transistor that has a small apparent size and a large lightly doped region. Therefore, this transistor has sufficient resistance to voltage for the gate electrode even with a reduced gate length. Therefore, it is possible to reduce the size of the transistor while it maintains resistance to voltage.

According to any of the above-mentioned methods, it is preferable that at least part of the second portion lie in an area other than the groove provided on the supporting substrate or the insulating substrate.

Consequently, the second portion can be made into the source or drain region in which an impurity is injected in a high concentration, for example. Therefore, a transistor having the LDD structure can be provided.

According to any of the above-mentioned methods, it is preferable that the impurity be injected into the semiconductor film at the predetermined angle for multiple times.

This method makes it possible to inject an impurity into the semiconductor film along the inner wall of the groove provided to the substrate without fail. Therefore, it is possible to inject an impurity evenly into the semiconductor film.

According to any of the above-mentioned methods, it is preferable that the insulating film be implanted in the groove.

By protecting the semiconductor film along the inner wall of the groove in a later process to inject an impurity into the second portion in a high concentration to make it the source or drain region, it is possible to provide a lightly doped region with a small apparent size without fail.

In this case, it is preferable that a side wall be provided to cover an upper surface of the semiconductor film covering an inner wall of the groove on the gate electrode side and reach a side surface of the gate electrode by etching the insulating film.

Since the side wall covers the upper surface of the semiconductor film covering the inner wall, it is possible to prevent heavy ion injection into the vicinity of the channel region under the gate electrode. Furthermore, no mask is required for the semiconductor film when injecting an impurity into the source or drain region in a high concentration. As a result, it is possible to simplify the ion injection process.

A substrate for an electrooptical device according to another aspect of the invention includes any of the above-mentioned transistors.

If the substrate for an electrooptical device is applied to a transmissive liquid crystal panel, the panel can provide a high-definition display with a high aperture ratio since it includes the transistor that has resistance to voltage with a reduced apparent size.

BRIEF DESCRIPTION OF THE DRAWINGS

The invention will be described with reference to the accompanying drawings, wherein like numbers reference like elements.

DESCRIPTION OF EXEMPLARY EMBODIMENTS

A transistor, a method for manufacturing thereof, and a substrate for an electrooptical device according to exemplary embodiments of the invention are hereinafter described. In the embodiments, a thin-film transistor (TFT) provided on an insulating substrate is described as the transistor.

Thin-Film Transistor

Figure 1:
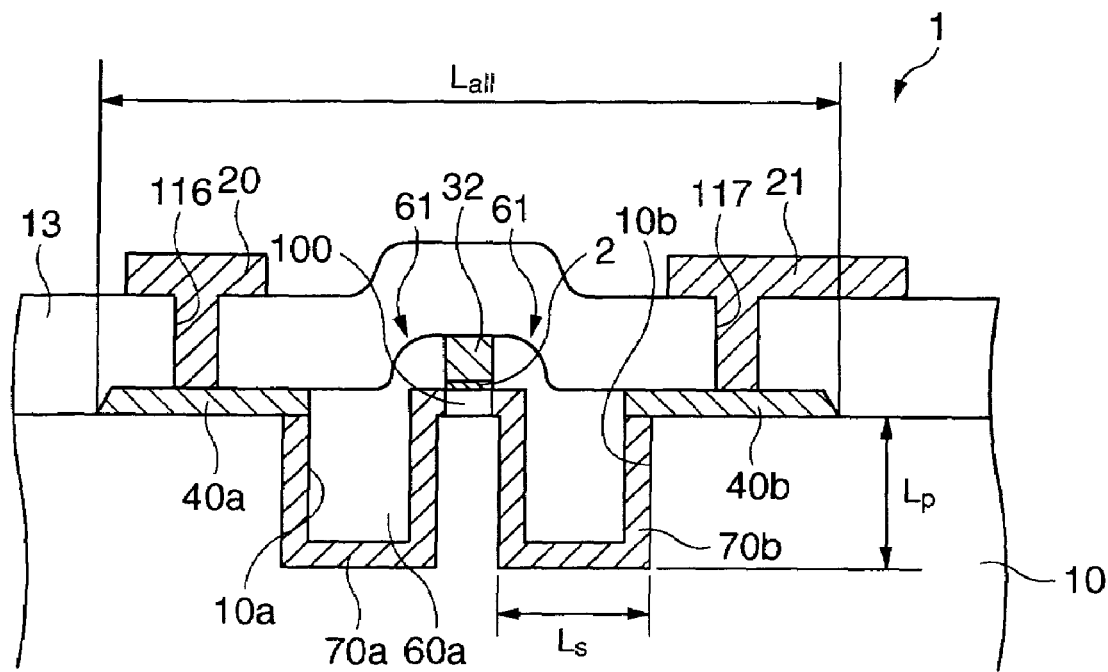
FIG. 1 is a sectional side view showing a thin-film transistor (TFT) according to one embodiment of the invention.

FIG. 1 shows a TFT according to one embodiment of the invention.

Referring to the drawing, this TFT 1 is an NMOS transistor. The drawing shows the apparent size of the TFT 1 indicated by $L_{all}$. It also shows a substrate 10 having a groove with a width of $L_s$ and a depth of $L_p$.

The apparent size of the TFT 1 means the length between the rims of its source and drain regions. Also, the apparent size of a semiconductor film, which will be described later, refers to the length between the rims of the regions when seen from the direction perpendicular to the substrate 10. In other words, being small in the apparent size means the TFT 1 occupies a small area on the substrate surface and the size of the TFT can be reduced.

Referring to FIG. 1, the TFT 1 includes a substrate (insulating substrate) 10 made of an insulating material, such as glass or quartz. On the substrate 10, the TFT 1 also includes a semiconductor film 42 made of polycrystalline silicon, a gate insulating film 2 covering this semiconductor film 42, a gate electrode 32, a source electrode 20 and a drain electrode 21 as main elements. An underlying insulating film made of silicon oxide, for example, on which the semiconductor film 42 is formed may be provided on the substrate 10. The semiconductor film 42 includes a channel region 100, a source region 40a and a drain region 40b. The semiconductor film 42 also includes a lightly doped source region 70a and a lightly doped drain region 70b, which will be described later.

More specifically, the semiconductor film 42 includes the channel region 100 placed face to face with the gate electrode 32, the lightly doped source region 70a between the channel region 100 and the source region 40a, and the lightly doped drain region 70b between the channel region 100 and the drain region 40b. The lightly doped source region 70a is a lightly doped region in which impurity ions are injected in a low concentration into the semiconductor film 42 by an impurity ion injection method, which will be described later. The lightly doped drain region 70b is another lightly doped region provided in the same manner.

The source region 40a and the drain region 40b are regions in which ions are injected in a higher concentration than the lightly doped source region 70a and the lightly doped drain region 70b, respectively.

The substrate 10 has grooves 10a and 10b. The lightly doped source region 70a and the lightly doped drain region 70b are provided along the inner wall of the grooves 10a and 10b, respectively. More specifically, the lightly doped source region 70a is provided along the inner wall of the groove 10a, while the lightly doped drain region 70b is provided along the inner wall of the groove 10b.

The grooves 10a and 10b are filled with an insulating part 60a by a method described later. The lightly doped source region 70a and the lightly doped drain region 70b provided along the inner wall of the grooves 10a and 10b have a detour channel along the side wall of the grooves in which holes or electrons in the semiconductor film flow.

For example, the insulating part 60a lies between one lightly doped source region 70a provided along the inner wall of one groove 10a on the gate electrode 32 side and another adjacent lightly doped source region 70a provided along the inner wall of another groove 10a on the source electrode 20 side, thereby preventing holes or electrons from flowing into each lightly doped source region 70a. Therefore, the channels of the lightly doped source region 70a and the lightly doped drain region 70b are large relative to their apparent sizes.

In other words, the TFT 1 of the present embodiment has the lightly doped drain (LDD) structure including lightly doped regions (70a, 70b) sandwiching the channel region 100 and the heavily doped source/drain regions (40a, 40b) provided in continuity with the lightly doped regions.

According to the present embodiment, the width $L_s$ of the grooves 10a and 10b is 0.5 μm and the depth $L_p$ of the grooves is 1.0 μm. The apparent size $L_{all}$ of the TFT 1 is 2.5 μm.

The apparent size of the lightly doped source region 70a and the lightly doped drain region 70b provided along the inner wall of the grooves 10a and 10b is 0.5 μm, which is the same as the width $L_s$ of the grooves.

The lightly doped source region 70a and the lightly doped drain region 70b are implanted in the grooves 10a and 10b, respectively, to a depth $L_p$ of 1.0 μm.

Therefore, the actual length of the lightly doped source region 70a and the lightly doped drain region 70b of the present embodiment is about 2.5 μm, which is a total of the apparent size (0.5 μm) and the depth to which they are implanted along the both side walls of each groove (1.0 μm*2). Consequently, the size of the lightly doped regions 70a and 70b is almost the same as the apparent size $L_{all}$ of the TFT 1 (2.5 μm).

With a related art TFT, it is necessary to enlarge the LDD region to increase an area available as an electric field to apply a high voltage to the gate electrode, while the gate length is reduced to make the transistor smaller. However, since the semiconductor film is directly provided on the substrate with no groove, the enlarged LDD region requires a large area. As a result, the size of the TFT as a whole cannot be sufficiently reduced.

With the TFT 1 of the present embodiment, the lightly doped regions can be enlarged with the detour channel, without changing the apparent size $L_{all}$ of the TFT 1 in comparison with the related art TFT. Since the lightly doped regions can be enlarged in comparison with such regions included in the related art TFT without changing the apparent size, it is possible to reduce the gate length and the size of the TFT 1 while maintaining the same level of resistance to voltage.

With the TFT 1 of the present embodiment including the lightly doped source region 70a and the lightly doped drain region 70b provided along the inner wall of the grooves 10a and 10b, the lightly doped regions can be enlarged by the depth of the grooves 10a and 10b without increasing the apparent sizes of the regions.

Furthermore, the TFT 1 having the LDD structure reduces off-leakage current. Also, the TFT 1 provided with the enlarged lightly doped regions has high resistance to voltage, and thus a high voltage can be applied to the gate electrode 32.

Since the lightly doped regions can be enlarged without changing their apparent sizes, it is possible to maintain resistance to voltage even with the reduced gate length to reduce the size of the TFT 1.

Therefore, the TFT 1 can be reduced in size while it has high resistance to voltage.

While the above-described embodiment adopts a single-gate structure having only one gate electrode, the TFT may have a multi-gate structure including a plurality of gate electrodes and a plurality of corresponding channel regions instead.

Furthermore, while the above-described embodiment provides the structure having the grooves on the both sides of the channel region 100 and the lightly doped regions along the inner wall of the grooves, it is also possible to provide a lightly doped region at least on the drain region 21 side.

Method for Manufacturing TFT

A method for manufacturing a TFT according to another embodiment of the invention will now be described.

In this embodiment, a method for manufacturing the TFT 1 (an NMOS TFT used as an example here) will be described with reference to the accompanying drawings. FIGS. 2 and 3 show steps to manufacture the TFT 1.

Figure 2A:
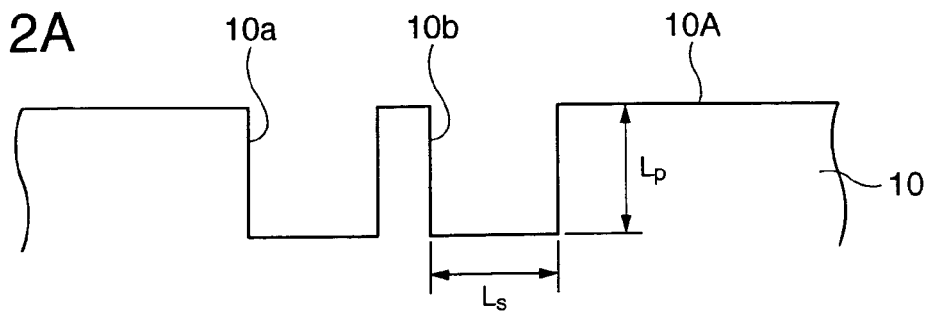
FIGS. 2A to 2D show a method for manufacturing the TFT.

Referring to FIG. 2A, the substrate 10 made of an insulating material, such as glass or quartz, is prepared. The substrate 10 is etched with a mask (not shown) to form the grooves 10a and 10b having the same shape.

Here, the grooves 10a and 10b are formed to a depth $L_p$ of 1.0 μm. The depth $L_p$ indicates how deep the lightly doped source and drain regions, which will be described later, are implanted in the substrate 10.

Also, the grooves 10a and 10b are formed to a width $L_s$ of 0.5 μm. The width $L_s$ indicates the apparent size of the lightly doped source region 70a and the lightly doped drain region 70b provided along the inner wall of the grooves as mentioned in greater detail later.

Figure 2B:
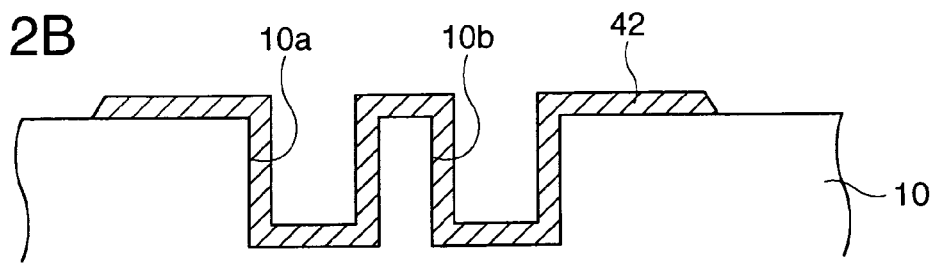

Referring to FIG. 2B, the semiconductor film 42 is provided along the inner wall of the grooves 10a and 10b to reach an upper surface 10A of the substrate 10 where the grooves 10a and 10b are not provided.

The semiconductor film 42 is provided by (1) forming an amorphous silicon layer by chemical vapor deposition (CVD), for example, (2) applying excimer laser or the like to make the amorphous silicon layer polycrystalline, and (3) patterning the layer by photolithography, for example, to provide a desirable shape. Specifically, a photoresist is applied to the amorphous silicon layer, exposed to light and developed. Then the layer is etched, and the photoresist is removed thereafter to complete patterning of the layer.

The semiconductor film 42 including a first portion along the inner wall of the grooves 10a and 10b is thus provided.

Instead, a polycrystalline silicon film may be provided by laser annealing after an amorphous silicon film is patterned. When a non-insulating supporting substrate is used to provide the semiconductor film 42, the surface of the supporting substrate and the grooves provided to the supporting substrate may be used as an underlying substrate functioning as a buffer and barrier layer. In this case, after providing silicon oxide to the underlying substrate to secure insulation, the semiconductor film 42 is provided on the underlying substrate. It is also possible to prepare the substrate 10 to which the grooves 10a and 10b are provided in advance.

Figure 2C:
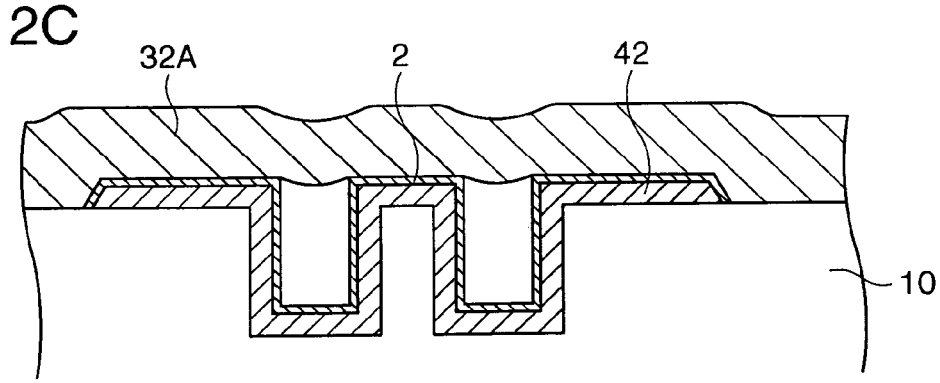

Referring next to FIG. 2C, a gate insulating film 2 made of silicon oxide is formed by plasma oxidation on the surface of the semiconductor film 42. Instead, the gate insulating film 2 may be formed by providing silicon oxide to a predetermined thickness by plasma CVD (PECVD), for example.

On the whole surface of the substrate 10 including the gate insulating film 2, a conductive-material film 32A of tantalum, for example, is provided by a known method. The gate electrode 32 is then formed by patterning using photolithography, for example.

Figure 2D:
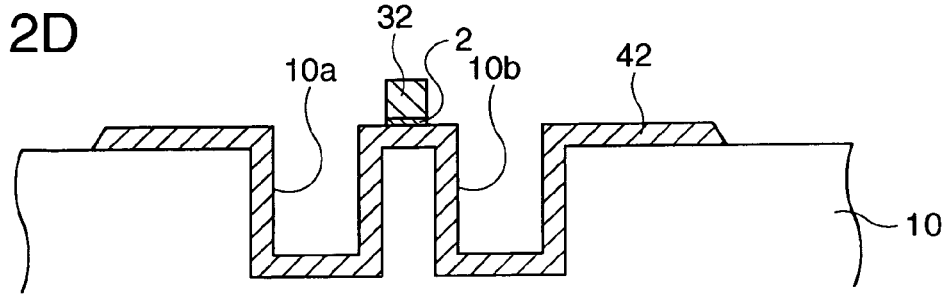

Specifically, a photoresist is applied to the substrate 10 on which the conductive-material film 32A has been provided, exposed to light and developed. Then the conductive material is etched, and the photoresist is removed thereafter to complete patterning of the material. As a result, the gate electrode 32 as shown in FIG. 2D is provided. Here, the gate electrode 32 is provided on the semiconductor film 42 with the gate insulating film 2 therebetween. While the gate insulating film 2 except for directly under the gate electrode 32 is removed by etching the conductive-material film 32A, it may be left unremoved to cover the whole surface of the semiconductor film 42. Examples of the conductive material may include metal materials, such as aluminum, molybdenum and tantalum, or an alloy whose main component is one of these metal materials.

Also, polysilicon may be used to form the gate electrode. When the gate electrode is made of polysilicon, ions of boron, for example, can be injected into the channel region to be provided in the semiconductor film under the gate electrode.

Figure 3A:
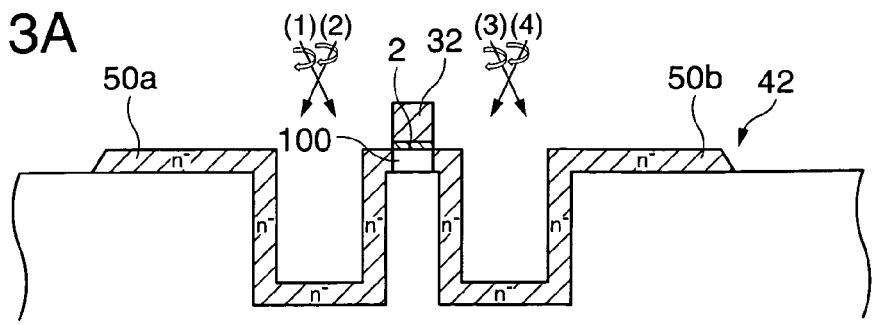
FIGS. 3A to 3D show manufacturing steps following the process shown in FIG. 2.

After forming the gate electrode 32, an impurity is injected into the semiconductor film 42 at a predetermined tilted angle to the substrate 10 as shown in FIG. 3A. The predetermined tilted angle means an angle at which an impurity can be injected into the semiconductor film 42 without fail even along the inner and particularly side walls of the grooves 10a and 10b. The inner wall includes the bottom. By adjusting the angle, an impurity can be surely injected into the semiconductor film 42 provided along the inner wall and the bottom of each groove.

The predetermined angle is not limited and is adjustable depending on the depth and width of the grooves 10a and 10b and the degree of impurity injection. The injection may be repeated for multiple times as will be described later.

The impurity is injected into the semiconductor film 42 from the upper side of the substrate 10 on which the semiconductor film 42 is formed, making a lightly doped region in which the impurity is dispersed in a low concentration in the semiconductor film 42. The impurity is injected by an ion injection method, such as ion doping and ion implantation.

As shown in FIG. 3A, ions are injected for four times at tilted angles with 60- and 90-degree rotations (shown by the arrows (1), (2), (3) and (4)) to the substrate 10 in the present embodiment.

For example, ion injection in the direction (1) can inject impurity ions in a desirable concentration into the semiconductor film 42 along the side wall of the groove 10a on the gate electrode 32 side, along the bottom of the groove 10a, and on the upper surface of the substrate 10.

Ion injection in the direction (2) can inject impurity ions in a desirable concentration into the semiconductor film 42 along the side wall of the groove 10a on the drain region side described in detail later, along the bottom of the groove 10a, and on the upper surface of the substrate 10.

Therefore, the semiconductor film 42 along the inner wall of the groove 10a becomes a lightly doped region $n^-$ in which ions are injected in a low concentration.

In the same manner, ion injection in the directions (3) and (4) makes the semiconductor film 42 along the side wall and the bottom of the groove 10b and on the upper surface of the substrate 10 the lightly doped region $n^-$. The gate electrode 32 provided above the semiconductor film 42 functions as a mask in the ion injection. Consequently, no ion is injected into an area of the semiconductor film 42 directly under the gate electrode 32. As a result, this area becomes an intrinsic semiconductor region to be the channel region 100 in which no ion is injected. In the present embodiment, phosphorus ($P^+$) ions are injected into the lightly doped region $n^-$ at an accelerating voltage of 15 keV and a dose amount of $1.0*10^{13}/cm^2$.

In the description hereof, a part of the semiconductor film 42 reaching the channel region 100 along the inner wall of the groove 10a is referred to as a source-side semiconductor film 50a, while another part of the semiconductor film 42 reaching the channel region 100 along the inner wall of the groove 10b is referred to as a drain-side semiconductor film 50b.

Therefore, the semiconductor film 42 includes the source-side semiconductor film 50a and the drain-side semiconductor film 50b, which are lightly doped regions, and the channel region 100.

Figure 3B:
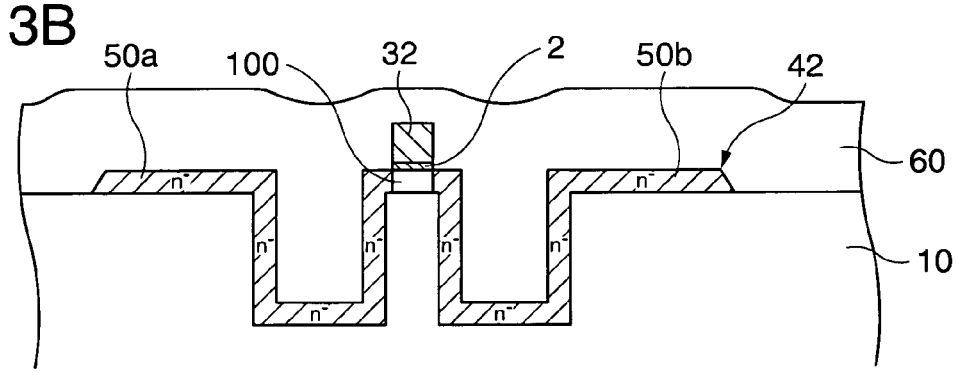
Figure 3C:
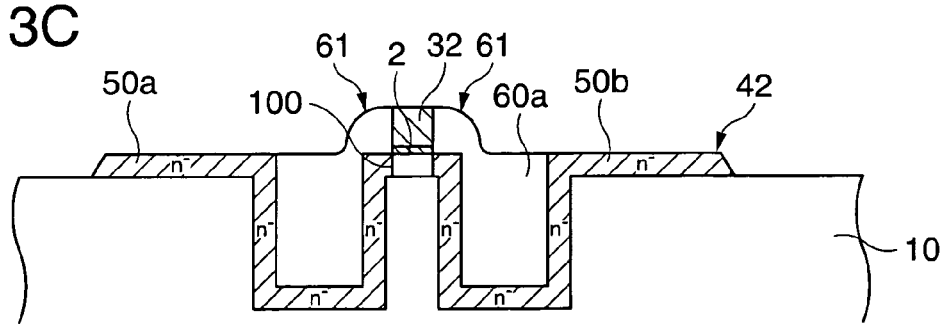

Referring next to FIG. 3B, an insulating film 60 covering the gate electrode 32 and the semiconductor film 42 is provided. According to the present embodiment, the insulating film 60 made of silicon oxide is provided by plasma CVD using tetraethoxysilane (TEOS) or oxygen gas, for example. Here, covering the semiconductor film 42 means that the insulating film is implanted in the grooves 10a and 10b.

As the insulating film 60 is implanted in the grooves 10a and 10b, it is possible to keep the semiconductor film 42 along the inner wall of the grooves including the lightly doped region $n^-$ from heavy ion injection in a later process to inject ions into the source or drain region in a high concentration.

After the insulating film 60 is formed on the substrate 10, a second portion of the semiconductor film 42 that is other than the first portion of the semiconductor film 42 implanted in the grooves 10a and 10b is exposed. Here, at least part of the second portion lies in an area other than the grooves 10a and 10b provided on the substrate 10. In other words, only the second portion of the semiconductor film 42 to be the source or drain region on the upper surface 10A of the substrate 10 is exposed by selectively etching the insulating film 60. Consequently, a transistor having the above-described LDD structure is provided by making the second portion into the source or drain region in which an impurity is injected in a high concentration as will be described below.

According to the present embodiment, the insulating film 60 is anisotropically etched by wet etching, for example. By adjusting etching conditions, part of the insulating film 32 becomes a side wall 61. The side wall 61 covers the upper surface of the semiconductor film 42, which are the source-side semiconductor film 50a and the drain-side semiconductor film 50b reaching the channel region 100, covering the inner wall of the grooves 10a and 10b on the gate electrode 32 side and reaches the side surface of the gate electrode 32.

Here, the insulating film 60 implanted in the grooves 10a and 10b becomes the insulating part 60a. The insulating part 60a is etched to become almost as high as the upper surface of the semiconductor film 42 to be the source/drain region that has been exposed to the upper surface 10A of the substrate 10.

Since the side wall 61 is provided to cover the upper surface of the portions of the semiconductor film 42 covering the inner wall of the grooves 10a and 10b and the side surface of the gate electrode 32, the semiconductor film 42 other than the source or drain region in which ions will be injected in a high concentration in a later process is wholly covered by the insulating film 60.

Figure 3D:
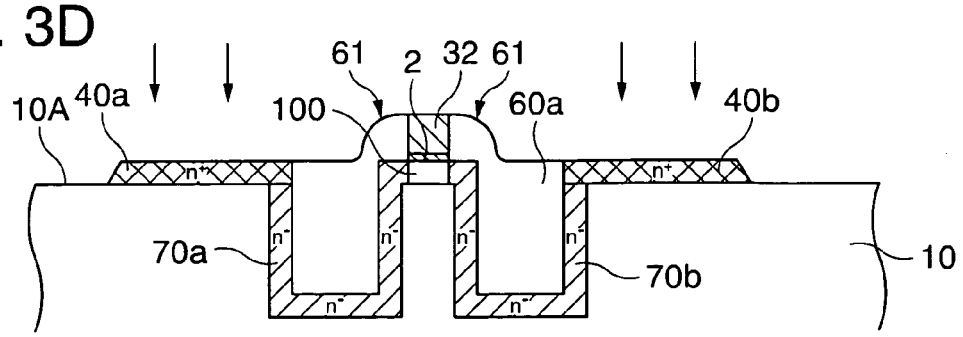

Referring next to FIG. 3D, ions are injected into the portion of the semiconductor film 42 exposed from the insulating film 60 from the upper surface side of the substrate 10 in a higher concentration than the ion concentration in the region n⁻, making the source region 40a or the drain region 40b.

According to the present embodiment, ions are heavily injected into the semiconductor film 42 by an ion injection method, such as ion doping and ion implantation. In the present embodiment, arsenic (As⁺) ions are injected into the portion of the semiconductor film 42 exposed from the insulating film 60 at an angle of 7 degrees to the substrate 10, an accelerating voltage of 15 keV and a dose amount of $2.0*10^{15}/cm^2$.

Here, the semiconductor film 42 other than the exposed portion is wholly covered by the insulating film 60. Therefore, ions are heavily injected only into the source and drain regions by self-alignment with no mask required. Therefore, it is possible to simplify the ion injection process.

Furthermore, since the side wall 61 covers the side surface of the gate electrode 32, it is possible to surely prevent heavy ion injection into the vicinity of the channel region under this gate electrode.

Here, heavy ion injection is conducted in a way that ions are injected only into a portion of the semiconductor film 42 provided higher than the upper surface 10A of the substrate 10. This process makes a heavily doped region n⁺ a source or drain region. If the lightly doped regions (70a, 70b) that are sufficiently large are provided, part of the semiconductor film 42 along the side wall of the grooves 10a and 10b can be made the source region 40a or the drain region 40b by adjusting an intensity of ion injection so as not to make the channel region 100 directly under the gate electrode 32 a heavily doped region.

The heavy ion injection provides the lightly doped source region 70a, in which ions are injected in a low concentration, and the source region 40a, in which ions are injected in a higher concentration, in the source-side semiconductor film 50a. Also, the heavy ion injection provides the lightly doped drain region 70b, in which ions are injected in a low concentration, and the drain region 40b, in which ions are injected in a higher concentration, in the drain-side semiconductor film 50b. Accordingly, the semiconductor film 42 has the LDD structure.

In the following process (not shown), the substrate 10 is heated to about 300 to 550 degrees C. with a heater, such as a furnace, so as to activate the ions injected to the semiconductor film 42.

Subsequently, a silicon oxide film is deposited to be an interlayer insulating film 13 shown in FIG. 1 that covers the gate electrode 32, the source region 40a, the drain region 40b and the insulating film 60.

Then as shown in FIG. 1, two contact holes 116 and 117 are formed through the interlayer insulating film 13 to reach the source region 40a and the drain region 40b of the semiconductor film 42 by photolithography.

Subsequently, a Ti—Al—Ti multilayer, for example, is provided on the interlayer insulating film 13 by sputtering or other method. The multilayer is then patterned by photolithography to provide the source electrode 20 and the drain electrode 21 electrically coupled to the source region 40a and the drain region 40b, respectively.

Through the above-described steps shown in FIGS. 2 and 3, the TFT 1 is manufacture to include the lightly doped source region 70a and the lightly doped drain region 70b provided along the inner wall of the grooves 10a and 10b, respectively, on the both sides of the channel region 100 in the semiconductor film 42.

As mentioned above, the TFT 1 includes the lightly doped source region 70a and the lightly doped drain region 70b whose actual size is 2.5 µm, while their apparent size is 0.5 µm.

Since the method for manufacturing a transistor provides the semiconductor film 42 along the inner wall of the grooves 10a and 10b provided to the substrate 10, the portion of the semiconductor film along the grooves 10a and 10b can be made larger than their apparent size in a planar view.

Since light ion injection is conducted at the predetermined angle to the substrate 10 in which ions can be injected into the semiconductor film 42 along the inner wall of the grooves 10a and 10b without fail, it is possible to provide the lightly doped source region 70a and the lightly doped drain region 70b along the inner wall of the grooves 10a and 10b in the semiconductor film 42.

By adjusting the depth of the grooves 10a and 10b, it is possible to provide the TFT 1 having a small apparent size and large lightly doped regions.

Therefore, it is possible to reduce the size of the TFT 1 while it maintains resistance to voltage. It is understood that a PMOS TFT and a CMOS TFT using NMOS and PMOS TFTs in combination can be manufactured in the same manner.

A substrate for an electrooptical device including the TFT according to the above-mentioned embodiment as yet another embodiment of the invention will now be described. Here, the substrate is applied to a transmissive liquid crystal panel. The transmissive liquid crystal panel can be used as a light valve for red, green or blue light included in a liquid crystal projector.

The transmissive liquid crystal panel included in the liquid crystal projector includes a liquid crystal layer sandwiched between a TFT substrate having the TFT according to the above-mentioned embodiment and an opposing substrate placed face to face with the TFT substrate.

The TFT substrate is provided with the above-described grooves. The TFT substrate includes lightly doped source and drain regions with a reduced apparent size and an enlarged actual length along the inner wall of the grooves.

Since this transmissive liquid crystal panel includes the lightly doped source and drain regions that are sufficiently large, it has sufficient resistance to voltage even with a reduced gate length to reduce its size.

In the liquid crystal projector, each light valve modulates components of light from a light source. The components are then injected into a dichroic prism in three directions where they are resynthesized. Consequently, a color image is enlarged and projected with high definition on a screen or the like via a projection lens.

What is claimed is:

1. A method for manufacturing a transistor, comprising:
   providing a semiconductor film on an insulating substrate provided with a groove by forming a first portion of the semiconductor film on an inner surface of the groove;
   providing a gate electrode above the semiconductor film;
   injecting an impurity into the semiconductor film at a predetermined angle to the insulating substrate using the gate electrode as a mask to form a lightly doped source or drain region, the predetermined angle being a tilted angle relative to the substrate;
   providing an insulating film covering the gate electrode and the semiconductor film, and exposing a second portion of the semiconductor film, other than the first portion, by etching part of the insulating film; and
   providing a source or drain region by injecting an impurity into at least part of the second portion, the source or drain region having an impurity concentration higher that the lightly doped source or drain region, and being in contact with the insulating substrate and the lightly doped source or drain region, wherein
   the source or drain region contacts the lightly doped source or drain region only at the first portion of the semiconductor film that is formed on the inner surface of the groove.

2. A method for manufacturing a transistor, comprising:
   providing an underlying insulating film on a supporting substrate provided with a groove;
   providing a semiconductor film on the underlying insulating film by forming a first portion of the semiconductor film inside the groove;
   providing a gate electrode above the semiconductor film;
   injecting an impurity into the semiconductor film at a predetermined angle to the supporting substrate using the gate electrode as a mask to form a lightly doped source or drain region, the predetermined angle being a tilted angle relative to the substrate;
   providing an insulating film covering the gate electrode and the semiconductor film, and exposing a second portion of the semiconductor film, other than the first portion, by etching part of the insulating film; and
   providing a source or drain region by injecting an impurity into at least part of the second portion, the source or drain region having an impurity concentration higher that the lightly doped source or drain region, and being in contact with the underlying insulating film and the lightly doped source or drain region, wherein
   the source or drain region contacts the lightly doped source or drain region only at the first portion of the semiconductor film that is formed on the inner surface of the groove.

3. The method for manufacturing a transistor according to claim 1, at least part of the second portion lying in an area other than the groove provided in the insulating substrate.

4. The method for manufacturing a transistor according to claim 1, the impurity being injected into the semiconductor film at the predetermined angle multiple times.

5. The method for manufacturing a transistor according to claim 1, the insulating film being implanted in the groove.

6. The method for manufacturing a transistor according to claim 5, a side wall being provided to cover an upper surface of the semiconductor film covering an inner wall of the groove on a gate electrode side and to extend to a side surface of the gate electrode, the side wall being formed by etching the insulating film.

7. The method for manufacturing a transistor according to claim 4, each of the multiple times of an injecting an impurity into the semiconductor film at the predetermined angle to the insulating substrate including a relative rotation between the insulating substrate and the injecting an impurity into the semiconductor film while maintaining the predetermined angle to the insulating substrate, the relative rotation between the insulating substrate and the injecting an impurity into the semiconductor film at the predetermined angle to the insulating substrate at one of the multiple times of injecting an impurity into the semiconductor film being different from the relative rotation between the insulating substrate and the injecting an impurity into the semiconductor film at the predetermined angle to the insulating substrate at another of the multiple times of injecting an impurity into the semiconductor film.

8. A method for manufacturing a transistor, comprising:
   forming a semiconductor film on an insulating substrate having a main surface and including a first portion having a first section on the main surface and a second section with a first groove in the insulating substrate, a second portion without a groove, and a third portion having a first section on the main surface and a second section with a second groove in the insulating substrate, the first and second sections of the first and third portions being adjacent each other, the second portion being positioned between the first portion and the third portion, and connecting the first groove with the second groove, the semiconductor film being formed on the first section of the first portion, along an inner wall of the first groove, the second portion, the first section of the third portion, and along an inner wall of the second groove;
   forming a gate electrode above the semiconductor film on the second portion of the insulating substrate;
   injecting a first impurity into the semiconductor film using the gate electrode as a mask;
   forming an insulating film that covers the gate electrode and the semiconductor film;
   etching a part of the insulating film to expose the semiconductor film on the first section and a part of the second section of the first portion, and on the first section and a part of the second section of the third portion, leaving another part of the insulating film as a side wall that covers a part of the gate electrode and the semiconductor film on the second portion; and
   injecting a second impurity with a higher concentration than the first impurity to the exposed semiconductor film on the first and second sections of the first portion and on the first and second sections of the third portion.

* * * * *